United States Patent
Lee et al.

(10) Patent No.: US 10,385,268 B2
(45) Date of Patent: Aug. 20, 2019

(54) PHOTOSENSITIVE RESIN COMPOSITION AND DISPLAY DEVICE

(71) Applicants: Samsung Display Co., Ltd, Yongin-si, Gyeonggi-do (KR); DONGWOO FINE-CHEM CO., LTD., Iksan-si, Jeollabuk-do (KR)

(72) Inventors: Baekhee Lee, Yongin-si (KR); Minki Nam, Anseong-si (KR); Junghyun Kwon, Seoul (KR); Youngmin Kim, Yongin-si (KR); Namseok Roh, Seongnam-si (KR); Haeil Park, Seoul (KR); Seontae Yoon, Seoul (KR); Donguk Kim, Hwaseong-si (KR); Kisoo Park, Hwaseong-si (KR); Kwangkeun Lee, Osan-si (KR); Junhan Lee, Incheon (KR); Juho Kim, Pyeongtaek-si (KR); Hyounwoo Kim, Pyeongtaek-si (KR); Hunsik Kim, Incheon (KR); Jongsoo Lee, Pyeongtaek-si (KR)

(73) Assignees: Samsung Display Co., Ltd. (KR); DONGWOO FINE-CHEM CO., LTD. (KR)

( * ) Notice: Subject to any disclaimer, the term of this patent is extended or adjusted under 35 U.S.C. 154(b) by 0 days.

(21) Appl. No.: 14/965,272

(22) Filed: Dec. 10, 2015

(65) Prior Publication Data
US 2016/0215213 A1    Jul. 28, 2016

(30) Foreign Application Priority Data

Jan. 23, 2015  (KR) .................. 10-2015-0011553

(51) Int. Cl.
*G03F 7/031*    (2006.01)
*G02B 5/20*     (2006.01)
(Continued)

(52) U.S. Cl.
CPC .............. *C09K 11/883* (2013.01); *G02B 1/04* (2013.01); *G02B 5/201* (2013.01); *G02B 5/223* (2013.01);
(Continued)

(58) Field of Classification Search
CPC .. G03F 7/0007; G03F 7/031; G02F 1/133514; G02F 1/133516; G02B 5/201; G02B 5/223
(Continued)

(56) References Cited

U.S. PATENT DOCUMENTS 6,051,368 A * 4/2000 Masuko ............... G03F 7/0325
                                                340/910
7,442,326 B2   10/2008 Setlur et al.
(Continued)

FOREIGN PATENT DOCUMENTS

CN    2014/172951 A  * 10/2014
JP    2003-303553 A  * 10/2003
(Continued)

OTHER PUBLICATIONS

Computer-generated translation of CN 104516039 (Apr. 2015).*
(Continued)

*Primary Examiner* — John A McPherson
(74) *Attorney, Agent, or Firm* — Innovation Counsel LLP (57) ABSTRACT

A photosensitive resin composition comprises: a solvent in an amount of about 60 percentage by weight (wt %) to about 95 wt %; and a solid content in an amount of about 5 wt % to about 40 wt %, with respect to a total weight of the photosensitive resin composition, wherein the solid content comprises with respect to a total weight of the solid content: a phosphor in an amount of about 5 wt % to about 90 wt %; a photopolymerizable compound in an amount of about 4 wt % to about 70 wt %; an acetophenone-based photopolymer-
(Continued)

ization initiator in an amount of about 0.1 wt % to about 20 wt %; and an alkali soluble resin in an amount of about 5 wt % to about 80 wt %, with respect to a total weight of the solid content.

10 Claims, 2 Drawing Sheets

(51) Int. Cl.
*C09K 11/88* (2006.01)
*G02B 1/04* (2006.01)
*G02B 5/22* (2006.01)
*G03F 7/00* (2006.01)
*G02F 1/1335* (2006.01)

(52) U.S. Cl.
CPC ............ *G03F 7/0007* (2013.01); *G03F 7/031* (2013.01); *G02F 1/133617* (2013.01); *G02F 2202/36* (2013.01)

(58) Field of Classification Search
USPC .................................. 430/7, 281.1; 349/106
See application file for complete search history.

(56) References Cited

U.S. PATENT DOCUMENTS

| | | | | |
|---|---|---|---|---|
| 2009/0091689 | A1* | 4/2009 | Rho | C09K 11/54 349/69 |
| 2010/0117110 | A1 | 5/2010 | Park et al. | |
| 2011/0084595 | A1* | 4/2011 | Yoo | C09K 11/7734 313/487 |
| 2011/0227474 | A1* | 9/2011 | Oshio | C09K 11/08 313/483 |
| 2011/0241534 | A1* | 10/2011 | Oshio | C09K 11/595 313/487 |
| 2014/0103269 | A1 | 4/2014 | Baek et al. | |
| 2014/0160408 | A1* | 6/2014 | Cho | G02F 1/133617 349/110 |
| 2015/0219965 | A1* | 8/2015 | Dong | G02F 1/133617 349/69 |
| 2015/0318506 | A1* | 11/2015 | Zhou | G02B 5/20 257/40 |
| 2016/0149091 | A1* | 5/2016 | Kondo | C09K 11/02 257/13 |
| 2016/0178966 | A1* | 6/2016 | Li | G02F 2/02 349/71 |

FOREIGN PATENT DOCUMENTS

| | | |
|---|---|---|
| KR | 10-2006-0014492 A | 2/2006 |
| KR | 10-05833640000 | 5/2006 |
| KR | 10-2007-0094679 A | 9/2007 |
| KR | 10-0655945 B1 | 12/2007 |
| KR | 10-2010-0053409 A | 5/2010 |
| KR | 10-2013-0000506 A | 1/2013 |
| KR | 10-2013-0039697 A | 4/2013 |
| KR | 10-2014-0046840 A | 4/2014 |
| WO | WO 2014/208478 A1 * | 12/2014 |

OTHER PUBLICATIONS

Computer-generated translation of JP 2003-303553 (Oct. 2003). (Year: 2003).*
Korean Communication corresponding to Korean Patent Application No. 10-2015-0011553 dated Mar. 7, 2019 8 pages.

* cited by examiner

PHOTOSENSITIVE RESIN COMPOSITION AND DISPLAY DEVICE

CROSS-REFERENCE TO RELATED APPLICATION

This application claims priority to and the benefit of Korean Patent Application No. 10-2015-0011553, filed on Jan. 23, 2015 with the Korean Intellectual Property Office, the disclosure of which is incorporated by reference herein in its entirety.

BACKGROUND

1. Field

Aspects of embodiments of the present invention relate to a photosensitive resin composition and a display device including a color filter prepared using the same.

2. Description of the Related Art

Display devices display images using light emitting elements. In recent times, flat panel display (FPD) devices are in wide use, most notably liquid crystal display (LCD) devices and organic light emitting diode (OLED) display devices.

Such display devices display desired colors using color filters. In general, a color filter allows light having a predetermined color to pass through and blocks light having a color different therefrom in order to represent a desired color. To this end, a color filter includes a pigment, which is a colorant, and may further include a dye for the effect of enhanced luminance.

However, such a color filter including a pigment or a dye-based colorant has limitations for enhancing luminance. Accordingly, research is being conducted on a color filter using a phosphor. Such a color filter using a phosphor represents a color based on a scheme in which a phosphor absorbs light from a predetermined light source to emit light having a wavelength different from that of the predetermined light source.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to a photosensitive resin composition including a phosphor and an acetophenone-based photopolymerization initiator.

Aspects of embodiments of the present invention are also directed to a display device including a color filter prepared using a photosensitive resin composition comprising a phosphor and an acetophenone-based photopolymerization initiator.

According to an exemplary embodiment of the present invention, a photosensitive resin composition comprises: a solvent in an amount of about 60 percentage by weight (wt %) to about 95 wt %; and a solid content in an amount of about 5 wt % to about 40 wt %, with respect to a total weight of the photosensitive resin composition, wherein the solid content comprises: a phosphor in an amount of about 5 wt % to about 90 wt %; a photopolymerizable compound in an amount of about 4 wt % to about 70 wt %; an acetophenone-based photopolymerization initiator in an amount of about 0.1 wt % to about 20 wt %; and an alkali soluble resin in an amount of about 5 wt % to about 80 wt %, with respect to a total weight of the solid content.

The photopolymerization initiator may comprise at least one compound selected from diethoxyacetophenone, 2-hydroxy-2-methyl-1-phenylpropan-1-one, benzyl dimethyl ketal, 2-hydroxy-1-[4-(2-hydroxyethoxy)phenyl]-2-methylpropan-1-one, 1-hydroxycyclohexyl phenyl ketone, 2-methyl-1-(4-methylthiophenyl)-2-morpholinopropan-1-one, 2-benzyl-2-dimethylamino-1-(4-morpholinophenyl)butane-1-one, and 2-hydroxy-2-methyl-1-[4-methylvinyl)phenyl]propan-1-one.

The photopolymerization initiator may comprise a compound represented by Chemical Formula 2:

[Chemical Formula 2]

wherein R2 through R5 are each independently a hydrogen atom, a halogen atom, a hydroxyl group, a phenyl group substituted or unsubstituted by an alkyl group having 1 to 12 carbon atoms, a benzyl group substituted or unsubstituted by an alkyl group having 1 to 12 carbon atoms, or a naphthyl group substituted or unsubstituted by an alkyl group having 1 to 12 carbon atoms.

The phosphor may comprise one of a red phosphor, a green phoshpor, and a blue phosphor.

The phosphor may be a quantum dot.

The quantum dot may comprise at least one selected from CdS, CdSe, CdTe, ZnS, ZnSe, ZnTe, HgS, HgSe, HgTe, GaN, GaP, GaAs, InP, and InAs.

The quantum dot may have a core-shell structure including a core and a shell covering the core, wherein the core comprises at least one compound selected from CdSe, CdS, CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN, InAs, and ZnO, and the shell comprises at least one compound selected from CdS, CdSe, CdTe, CdO, ZnS, ZnSe, ZnTe, ZnO, InP, InS, GaP, GaN, GaO, InZnP, InGaP, InGaN, InZnSCdSe, PbS, TiO, SrSe, and HgSe.

The phosphor may comprise at least one compound selected from $Y_3Al_5O_{12}:Ce^{3+}$ (YAG:Ce), $Tb_3Al_5O_{12}:Ce3^+$ (TAG:Ce), $(Sr,Ba,Ca)_2SiO_4:Eu^{2+}$, $(Sr,Ba,Ca,Mg,Zn)_2Si(OD)_4:Eu^{2+}$ (D=F,Cl, S,N,Br), $Ba_2MgSi_2O_7:Eu^{2+}$, $Ba_2SiO_4:Eu^{2+}$, $Ca_3(Sc,Mg)_2Si_3O_{12}:Ce^{3|}$, $(Ca,S\ r)S:Eu^{2|}$, $(Sr,Ca)Ga_2S_4:Eu^{2|}$, $SrSi_2O_2N_2:Eu^{2|}$, $SiAlON:Ce^{3|}$, $β-SiAlON:Eu^{2+}$, $Ca-α-SiAlON:Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, and $BaMg_2Al_{16}O_{27}:Eu^{2+}$.

According to another exemplary embodiment of the present invention, a display device comprises: a substrate; and a plurality of color filters on the substrate, wherein the color filter comprises a polymer resin, a phosphor, and an acetophenone-based compound.

The acetophenone-based compound may include at least one compound selected from diethoxyacetophenone, 2-hydroxy-2-methyl-1-phenylpropan-1-one, benzyl dimethyl ketal, 2-hydroxy-1-[4-(2-hydroxyethoxy)phenyl]-2-methyl-propan-1-one, 1-hydroxycyclohexyl phenyl ketone, 2-methyl-1-(4-methylthiophenyl)-2-morphohnopropan-1-one, 2-benzyl-2-dimethylamino-1-(4-morpholinophenyl)butane-1-one, and 2-hydroxy-2-methyl-1-[4-(1-methylvinyl) phenyl]propan-1-one.

The acetophenone-based compound may include a compound represented by Chemical Formula 2:

[Chemical Formula 2]

wherein $R_2$ through $R_5$ are each independently a hydrogen atom, a halogen atom, a hydroxyl group, a phenyl group substituted or unsubstituted by an alkyl group having 1 to 12 carbon atoms, a benzyl group substituted or unsubstituted by an alkyl group having 1 to 12 carbon atoms, or a naphthyl group substituted or unsubstituted by an alkyl group having 1 to 12 carbon atoms.

The phosphor may include one of a red phosphor, a green phoshpor, and a blue phosphor.

The phosphor may be a quantum dot.

The quantum dot may comprise at least one compound selected from CdS, CdSe, CdTe, ZnS, ZnSe, ZnTe, HgS, HgSe, HgTe, GaN, GaP, GaAs, InP, and InAs.

The quantum dot may have a core-shell structure including a core and a shell covering the core, wherein the core comprises at least one compound selected from CdSe, CdS, CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN InAs, and ZnO, and the shell comprises at least one selected from CdS, CdSe, CdTe, CdO, ZnS, ZnSe, ZnTe, ZnO, InP, InS, GaP, GaN, GaO, InZnP, InGaP, InGaN, InZnSCdSe, PbS, TiO, SrSe, and HgSe.

The the phosphor may comprise at least one compound selected from $Y_3Al_5O_{12}:Ce^{3+}$ (YAG:Ce), $Tb_3Al_5O_{12}:Ce^{3+}$ TAG:Ce), $(Sr,Ba,Ca)_2SiO_4:Eu^{2+}$, $(Sr,Ba,Ca,Mg,Zn)_2Si(OD)_4:Eu^{2+}$ (D=F,Cl, S,N,Br), $Ba_2MgSi_2O_7:Eu^{2+}$, $Ba_2SiO_4:Eu^{2+}$, $Ca_3(Sc,Mg)_2Si3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, β-SiAlON:$Eu^{2+}$, Ca-α-SiAlON:$Eu^{2+}$, $Ba_3Si_6O_{12}N_2:Eu^{2+}$, $CaAlSiN_3:Eu^{2+}$, $(Sr,Ca)AlSiN_3:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, and $BaMg_2Al_{16}O_{27}:Eu^{2+}$.

The foregoing is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The above and other features and aspects of the present disclosure of invention will be more clearly understood from the following detailed description taken in conjunction with the accompanying drawings, in which.

DETAILED DESCRIPTION

Hereinafter, embodiments of the present invention will now be described in more detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art.

All terminologies used herein are merely used to describe embodiments of the inventive concept and may be modified according to the relevant art and the intention of an applicant. Therefore, the terms used herein should be interpreted as having a meaning that is consistent with their meanings in the context of the present disclosure, and is not intended to limit the invention.

In the drawings, certain elements or shapes may be simplified or exaggerated to better illustrate the present invention, and other elements present in an actual product may also be omitted. Thus, the drawings are intended to facilitate the understanding of the present invention. Like reference numerals refer to like elements throughout the specification.

In addition, when a layer or element is referred to as being "on" another layer or element, the layer or element may be directly on the other layer or element, or one or more intervening layers or elements may be interposed therebetween.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Hereinafter, a first exemplary embodiment of the present invention will be described with reference to FIG. 1.

Figure 1:
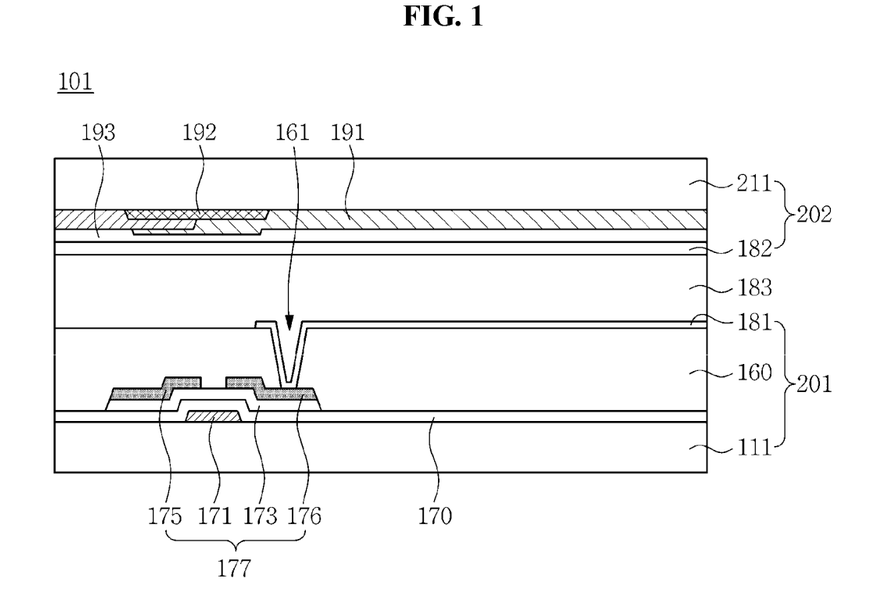
FIG. 1 is a cross-sectional view illustrating a display device according to a first exemplary embodiment of the present invention.

FIG. 1 is a cross-sectional view illustrating a display device according to a first exemplary embodiment of the present invention. The display device of FIG. 1 is a liquid crystal display (LCD) device 101.

The LCD device 101 may comprise an array substrate 201, an opposing substrate 202, and a liquid crystal layer 183 disposed between the array substrate 201 and the opposing substrate 202.

The array substrate 201 may comprise a first substrate 111, a gate insulating layer 170, a thin film transistor (TFT) 177, a planarization layer 160, and a first electrode 181.

The first substrate 111 may be formed of transparent glass, plastic, or the like.

A gate electrode 171 and a gate line (not illustrated) may be disposed on the first substrate 111.

The gate insulating layer 170 may be disposed on the first substrate 111 on which the gate line is disposed. The gate insulating layer 170 may be formed of an inorganic material such as silicon nitride ($SiN_x$) or silicon oxide ($SiO_x$).

A semiconductor layer 173 may be disposed on the gate insulating layer 170. The semiconductor layer 173 may comprise silicon and may comprise an oxide semiconductor.

The oxide semiconductor may comprise, for example, at least one of indium (In), zinc (Zn), gallium (Ga), tin (Sn), and hafnium (Hf).

A source electrode 175 and a drain electrode 176 may be disposed on the semiconductor layer 173 overlapping at least portions of the source electrode 175 and the drain electrode 176, respectively. The source electrode 175 and the drain electrode 176 may be spaced apart from one another, the source electrode 175 being connected to a data line (not illustrated); the drain electrode 176 being connected to the first electrode 181.

The gate electrode 171, the source electrode 175, the drain electrode 176, and the semiconductor layer 173 may configure the TFT 177.

The planarization layer 160 may be disposed on the TFT 177. The planarization layer 160 may be formed of an inorganic material such as $SiN_x$ or $SiO_x$ or an organic material. In addition, the planarization layer 160 may have a multilayer structure including an inorganic layer and an organic layer. The planarization layer 160 may have a contact hole 161 through which a portion of the drain electrode 176 is exposed.

The first electrode 181 may be disposed on the planarization layer 160. The first electrode 181 may be disposed to correspond to a pixel region, and may be connected to the drain electrode 176 through the contact hole 161.

The opposing substrate 202 may comprise a second substrate 211, a color filter 191, a black matrix (BM) 192, an overcoat layer 193, and a second electrode 182.

The second substrate 211 may be formed of transparent glass, plastic, or the like.

The black matrix 192 may be disposed on a surface of the second substrate 211 opposite to the first substrate 111. The black matrix 192 may be disposed to correspond to a region other than the pixel region to define the pixel region. For example, the black matrix 192 may overlap the data line, the gate line, and the TFT 177.

The color filter 191 may be disposed in the pixel region defined by the black matrix 192. The color filter 191 may provide color to light passing through the liquid crystal layer 183. The color filter 191 may be one of a red color filter, a green color filter, and a blue color filter. The color filter 191 may display a color other than red, green, and blue. The color filter 191 may overlap a portion of the black matrix 192.

The color filter 191 may comprise a polymer resin and a phosphor having a particle size in a range of about 2 nanometers (nm) to about 10 nm which is dispersed in the polymer resin. In addition, the color filter 191 may be prepared using a photosensitive resin composition including a phosphor. A description pertaining to the color filter 191 and the photosensitive resin composition used to prepare the color filter is provided below.

The overcoat layer 193 may be disposed on the color filter 191 and the black matrix 192. The overcoat layer 193 may planarize an upper surface of the color filter 191 and may protect the color filter 191. The overcoat layer 193 may be formed of, for example, an acrylic epoxy material.

The second electrode 182 may be disposed on the overcoat layer 193. The second electrode 182 may be electrically connected to a common line (not illustrated). The second electrode 182 may have a slit pattern having a plurality of apertures. The second electrode 182 may comprise a transparent conductive material. For example, the second electrode 182 may be formed of indium tin oxide (ITO) or indium zinc oxide (IZO).

The liquid crystal layer 183 may be disposed between the array substrate 201 and the opposing substrate 202. The liquid crystal layer 183 may comprise liquid crystal molecules having optical anisotropy. The liquid crystal molecules may be aligned by an electric field, such that an amount of transmitted light passing through the liquid crystal layer 183 may be adjusted.

Figure 2:
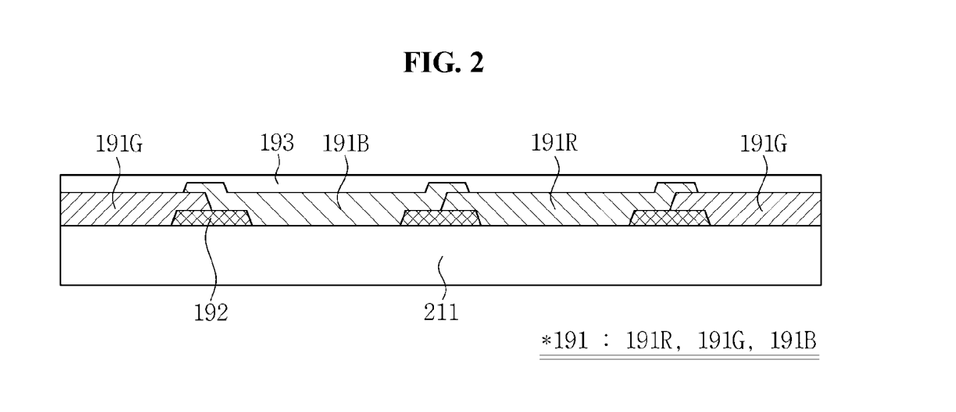
FIG. 2 is a cross-sectional view illustrating a color filter substrate.

Hereinafter, a preparation method of a color filter substrate will be described with reference to FIG. 2. The color filter substrate may correspond to a portion of the opposing substrate 202 other than the second electrode 182.

The color filter substrate may comprise a red color filter 191R, a green color filter 191G, and a blue color filter 191B which are disposed on the second substrate 211. The red, green, and blue color filters 191R, 191G, and 191B may each be disposed in a region corresponding to a pixel electrode, that is, the first electrode 181. In the case in which a light source of the display device is a blue light source, the blue color filter 191B may be omitted, or a transparent non-emitting layer may be used.

The red, green, and blue color filters 191R, 191G, and 191B, respectively, may be prepared using photosensitive resin compositions comprising phosphors.

For example, the red, green, and blue color filters 191R, 191G, and 191B may be prepared by the following processes.

The black matrix 192 may be formed on the second substrate 211. A light shielding layer, for example, a chromium (Cr) layer, may be formed on a surface of the second substrate 211 to be patterned through a photo-etching process, whereby the black matrix 192 is formed. Alternatively, the black matrix 192 may also be formed through an inkjet process using an organic material.

A photosensitive resin composition may be coated on the second substrate 211 on which the black matrix 192 is formed. The photosensitive resin composition may comprise a phosphor having a particle size in a range of about 2 nm to about 10 nm, a photopolymerizable compound, a photopolymerization initiator, an alkali soluble resin, a dispersant, and a solvent.

In the case in which the red, green, and blue color filters 191R, 191G, and 191B are sequentially formed, a photosensitive resin composition for preparing the red color filter 191R comprising a phosphor emitting red light may be initially coated on the second substrate 211. The photosensitive resin composition for preparing the red color filter 191R may also be coated on the black matrix 192.

The photosensitive resin composition for preparing the red color filter 191R which is coated on the second substrate 211 may be selectively irradiated with light. In this instance, a pattern mask may be used. The pattern mask may comprise a light shielding portion and a light transmitting portion, and the light transmitting portion may be provided corresponding to a position in the photosensitive resin composition at which the red color filter 191R is to be formed.

A development process may be performed. A non-exposed portion of the photosensitive resin composition may be removed by the development process, such that a red color filter pattern formed of the photosensitive resin composition may be produced.

The photosensitive resin composition may be cured by light or heat to complete the red color filter 191R. In detail, through the curing of the photosensitive resin composition, a polymer component such as a photopolymerizable compound may be polymerized to form a polymer resin, and phosphors may be dispersed in the polymer resin to complete the color filter.

The green and blue color filters 191G and 191B may be formed through substantially the same process as that of forming the red color filter 191R. The green color filter 191G may comprise a phosphor emitting green light, and the blue color filter 191B may comprise a phosphor emitting blue light.

The color filter substrate may be used in an LCD device and also in an organic light emitting diode (OLED) display device. In the case in which the color filter substrate is used in an OLED display device, an OLED element may be disposed downwardly or upwardly of the color filter. The OLED element may be disposed on an additional substrate other than the color filter substrate.

Hereinafter, a second exemplary embodiment will be described with reference to FIG. 3. A repeated description of the same configuration of the display device described in the first exemplary embodiment will be omitted herein for conciseness.

Figure 3:
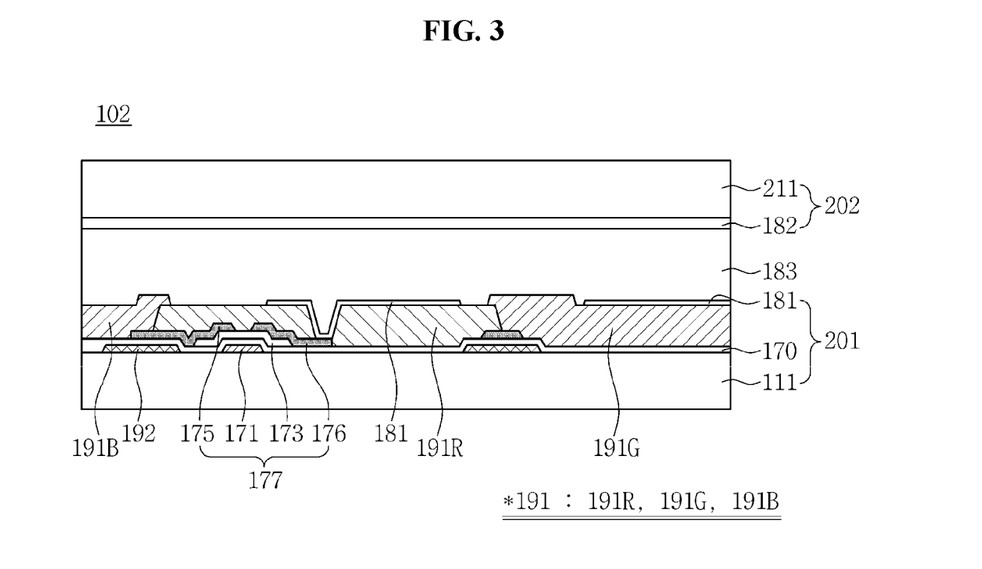
FIG. 3 is a cross-sectional view illustrating a display device according to a second exemplary embodiment of the present invention.

FIG. 3 is a cross-sectional view illustrating a display device according to a second exemplary embodiment of the present invention. The display device of FIG. 3 is an LCD device 102.

The LCD device 102 of the second exemplary embodiment may comprise an array substrate 201, an opposing substrate 202, and a liquid crystal layer 183 disposed between the array substrate 201 and the opposing substrate 202.

A gate electrode 171 and a black matrix 192 may be disposed on a first substrate 111, and a gate insulating layer 170 may be disposed on the gate electrode 171 and the black matrix 192. The black matrix 192 may extend in a direction parallel with respect to a data line (not illustrated).

A semiconductor layer 173, a source electrode 175, and a drain electrode 176 may be formed on the gate insulating layer 170, and then a color filter 191 may be formed. The color filter 191 may comprise a red color filter 191R, a green color filter 191G, and a blue color filter 191B.

A contact hole may be formed on the color filter 191, such that a portion of the drain electrode 176 is exposed therethrough. A first electrode 181, that is a pixel electrode, may be disposed on the color filter 191 to be connected to the drain electrode 176 of a TFT through the contact hole.

A second electrode 182 may be disposed on a second substrate 211.

Hereinafter, a photosensitive resin composition according to a third exemplary embodiment will be described. The photosensitive resin composition according to the third exemplary embodiment may be used to prepare a color filter.

The photosensitive resin composition may comprise a solvent in an amount of about 60 percentage by weight (wt %) to about 95 wt % and a solid content in an amount of about 5 wt % to about 40 wt % with respect to a total weight of the photosensitive resin composition. The solid content may comprise a phosphor, a photopolymerizable compound, a photopolymerization initiator, an alkali soluble resin, and a dispersant. In the photosensitive resin composition according to the third exemplary embodiment, a component aside from the solvent will be referred to as the solid content. Accordingly, even a liquid component may correspond to the solid content in the case in which the liquid component is not used as a solvent.

The phosphor may comprise one of a red phosphor absorbing light from a predetermined light source to emit red light, a green phosphor absorbing light from a predetermined light source to emit green light, and a blue phosphor absorbing light from a predetermined light source to emit blue light. For example, as the phosphor, at least one selected from a red phosphor absorbing ultraviolet (UV) light having a wavelength in a range of about 100 nm to about 350 nm to emit red light having a wavelength in a range of about 620 nm to about 740 nm, a green phosphor absorbing ultraviolet (UV) light having a wavelength in a range of about 100 nm to about 350 nm to emit green light having a wavelength in a range of about 500 nm to about 580 nm, and a blue phosphor absorbing ultraviolet (UV) light having a wavelength in a range of about 100 nm to about 350 nm to emit blue light having a wavelength in a range of about 420 nm to about 490 nm may be used. The color filter prepared using the photosensitive resin composition including such a phosphor may be employed in the display device using a UV light as a light source.

In addition, the phosphor may comprise one of a red phosphor absorbing blue light to emit red light and a green phosphor absorbing blue light to emit green light. The color filter prepared using the photosensitive resin composition comprising such a phosphor may be employed in a display device using a blue light as a light source.

As the phosphor, a quantum dot (QD) may be used.

The quantum dot may be prepared based on a known scheme. For example, the quantum dot may be prepared based on a wet chemical scheme using a metal precursor. In detail, the quantum dot may be prepared in a manner in which a metal precursor is injected into an organic solvent in the presence of a dispersant to grow a crystal therefrom at a predetermined temperature; however, the preparation scheme of the quantum dot is not limited thereto.

The quantum dot may be composed of elements from groups II-IV, V, III-V, II-VI or IV-VI of the periodic table. The quantum dots may be used alone or in combination of two or more thereof.

The quantum dot may include at least one selected from CdS, CdSe, CdTe, ZnS, ZnSe, ZnTe, HgS, HgSe, HgTe, GaN, GaP, GaAs, InP, and InAs. However, the material forming the quantum dot is not limited thereto, and the quantum dot may comprise other elements. In addition, two or more kinds of the quantum dots may be used together.

The quantum dot may have an average particle size in a range of about 2 nm to about 10 nm. In the case in which the quantum dot has the average particle size in the range of about 2 nm to about 10 nm, the quantum dot may function as a quantum dot, and may have dispersibility within the photosensitive resin composition.

In addition, the quantum dot may have a core-shell structure, and may have a gradient in terms of composition thereof.

For example, the quantum dot may have a core-shell structure including a core and a shell covering the core.

The core may comprise at least one compound selected from CdSe, CdS, CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN, InAs, and ZnO; however, the material forming the core is not limited thereto.

The shell may comprise at least one compound selected from CdS, CdSe, CdTe, CdO, ZnS, ZnSe, ZnTe, ZnO, InP, InS, GaP, GaN, GaO, InZnP, InGaP, InGaN, InZnSCdSe, PbS, TiO, SrSe, and HgSe; however, the material forming the shell is not limited thereto.

The core of the quantum dot having the core-shell structure may have an average particle size in a range of about 2 nm to about 5 nm. In addition, the shell may have an average thickness in a range of about 2 nm to about 5 nm. In the case in which the quantum dot has an average particle size and average thickness in the above range, the quantum dot may function as a phosphor, and may have dispersibility within the photosensitive resin composition.

The components forming the core and the shell, the particle size of the core, the thickness of the shell, the particle size of the quantum dot may be adjusted, such that the quantum dot may function as the red phosphor, the green phosphor, or the blue phosphor.

In addition, the phosphor may comprise at least one compound selected from the group consisting of $Y_3Al_5O_{12}$:$Ce^{3+}$ (YAG:Ce), $Tb_3Al_5O_{12}$:$Ce^{3+}$ (TAG:Ce), $(Sr,Ba,Ca)_2SiO_4$:$Eu^{2+}$, $(Sr,Ba,Ca,Mg,Zn)_2Si(OD)_4$:$Eu^{2+}$ (D=F,Cl,S,N,Br), $Ba_2MgSi_2O_7$:$Eu^{2+}$, $Ba_2SiO_4$:$EU^{2+}$, $Ca_3(SC,Mg)_2Si3O_{12}$:$Ce^{3+}$, $(Ca,Sr$:$EU^{2+}$, $(Sr,Ca)Ga_2S_4$:$EU^{2+}$, $SrSi_2O_2N_2$:$EU^{2+}$, $SiAlON$:$Ce^{3+}$, $\beta$-$SiAlON$:$Eu^{2+}$, $Ca$-$\alpha$-$SiAlON$:$Eu^{2+}$, $Ba_3Si_6O_{12}N_2$:$Eu^{2+}$, $CaAlSiN_3$:$Eu^{2+}$, $(Sr,Ca)AlSiN_3$:$Eu^{2+}$, $Sr_2Si_5N_8$:$Eu^{2+}$, $(Sr,Ba)Al_2O_4$:$Eu^{2+}$, $(Mg,Sr)Al_2O_4$:$Eu^{2+}$, and $BaMg_2Al_{16}O_{27}$:$Eu^{2+}$. The phosphor may be included in the photosensitive resin composition in an amount of about 5 wt % to about 90 wt % with respect to a total weight of the solid content of the photosensitive resin composition. In the case in which the amount of the phosphor is in the range of about 5 wt % to about 90 wt %, a color filter pattern may be readily formed and color conversion efficiency may be excellent; in the case in which the amount of the phosphor is below 5 wt %, light emission efficiency may be decreased; and in the case in which the amount of the phosphor is above 90 wt %, the color filter pattern may be difficult to be formed. For example, the phosphor may be used in a range of about 10 wt % to about 80 wt % with respect to the total weight of the solid content.

The photopolymerizable compound may be a compound polymerizable by light. The photopolymerizable compound may include a monofunctional monomer and a polyfunctional monomer, where functionality refers to the number of unsaturated bonds that can take part in a reaction.

The monofunctional monomer may include nonylphenyl carbitol acrylate, 2-hydroxy-3-phenoxypropyl acrylate, 2-ethylhexyl carbitol acrylate, 2-hydroxyethyl acrylate, N-vinyl pyrrolidone (NVP), and the like.

The polyfunctional monomer may include a difunctional monomer such as 1,6-hexanedioldi(meth)acrylate, ethyleneglycoldi(meth)acrylate, neopentylglycoldi(meth)acrylate, triethyleneglycoldi(meth)acrylate, bisphenol A bis(acryloyloxy ethyl)ether, and 3-methylpentanedioldi(meth)acrylate.

In addition, the polyfuntional monomer may include trimethylolpropanetri(meth)acrylate, ethoxylatedtrimethylolpropanetri(meth)acrylate, propoxylatedtrimethylolpropanetri(meth)acrylate, pentaerythritoltri(meth)acrylate, pentaerythritoltetra(meth)acrylate, dipentaerythritolpenta(meth)acrylate, ethoxylateddipentaerythritolhexa(meth)acrylate, propoxylateddipentaerythritolhexa(meth)acrylate, dipentaerythritolhexa(meth)acrylate, and the like.

An example of the polyfunctional monomer may be dipentaerythritol(poly)acrylate represented by Chemical Formula 1.

[Chemical Formula 1]

In Chemical Formula 1, $R_1$ is hydrogen or an acryloyl group having 2 to 6 carbon atoms.

The photopolymerizable compound may be included in the photosensitive resin composition in an amount of about 4 wt % to about 70 wt % with respect to the total weight of the solid content of the photosensitive resin composition. In the case in which the amount of the photopolymerizable compound is in the range of about 4 wt % to about 70 wt %, a process of forming a pattern using selective exposure may be readily performed. In the case in which the amount of the photopolymerizable compound is below 4 wt %, photocurability with respect to a UV light may be reduced such that the pattern may be difficult to form; and in the case in which the amount of the photopolymerizable compound is above 70 wt %, pattern exfoliation may occur. For example, the photopolymerizable compound may be used in a range of about 10 wt % to about 60 wt % with respect to the total weight of the solid content.

The photopolymerization initiator may use an acetophenone-based compound. A compound that is described using the suffix "-based" added to a known chemical or chemical group is a compound that comprises that known chemical group, which may be substituted. Thus, an acetophenone-based compound is a compound comprising an acetophenone group or a substituted acetophenone group. The acetophenone-based compound may be used alone or in combination of two or more compounds thereof.

Among the examples of the photopolymerization initiator, the acetophenone-based compound may include, for example, an oligomer such as diethowacetophenone, 2-hydroxy-2-methyl-1-phenylpropan-1-one, benzyldimethylketal, 2-hydroxy-1-[4-(2-hydroxyethoxy)phenyl]-2-methyl-propan-1-one, 1-hydroxycyclohexyl-phenylketone, 2-methyl-1-(4-methylthiophenyl)-2-morpholinopropan-1-one, 2-benzyl-2-dimethylamino-1-(4-morpholinophenyl)butan-1-one, and 2-hydroxy-2-methyl-1-[4-(1-methylvinyl)phenyl]propan-1-one.

For example, an acetophenone-based compound represented by Chemical Formula 2 may be used as the photopolymerization initiator.

[Chemical Formula 2]

In Chemical Formula 2, $R_2$ through $R_5$ are each independently a hydrogen atom, a halogen atom, a hydroxyl group, a phenyl group substituted or unsubstituted by an alkyl group having 1 to 12 carbon atoms, a benzyl group substituted or unsubstituted by an alkyl group having 1 to 12 carbon atoms, or a naphthyl group substituted or unsubstituted by an alkyl group having 1 to 12 carbon atoms.

The compound represented by Chemical Formula 2 may include, for example, 2-methyl-2-amino(4-morpholinophenyl)ethan-1-one, 2-ethyl-2-amino(4-morpholinophenyl)ethan-1-one, 2-propyl-2-amino(4-morpholinophenyl)ethan-1-one, 2-butyl-2-amino(4-morpholinophenyl)ethan-1-one, 2-methyl-2-amino(4-morpholinophenyl)propan-1-one, 2-methyl-2-amino(4-morpholinophenyl)butan-1-one, 2-ethyl-2-amino(4-morpholinophenyl)propan-1-one, 2-ethyl-2-amino(4-morpholinophenyl)butan-1-one, 2-methyl-2-methylamino(4-morpholinophenyl)propan-1-one, 2-methyl-2-dimethylamino(4-morpholinophenyl)propan-1-one, and 2-methyl-2-diethylamino(4-morpholinophenyl)propan-1-one.

The acetophenone-based compound may generate a small amount of free radicals compared to other known photoinitiators during a reaction process. In particular, during exposure and development processes for forming the color filter pattern, the acetophenone-based compound may generate a small amount of free radicals, and because the amount of free radicals is reduced, damage to the phosphor included in the photosensitive resin composition may be suppressed. Accordingly, the color filter may represent a high-quality color.

In addition to the acetophenone-based compound, at least one selected from a polyfunctional thiol-based compound having two or more mercapto groups per molecule, a triazine-based compound, a biimidazole-based compound, and an oxime-based compound may be used as the photopolymerization initiator.

The polyfunctional thiol-based compound containing the two or more mercapto groups per molecule may include tris-(3-mercaptopropionyloxy)-ethyl-isocyanurate, trimethyl olpropane tris-3-mercaptopropionate, pentaerythritol tetrakis-3-mercaptopropionate, dipenta erythritol tetrakis-3-mercaptopropionate, and the like.

The triazine-based compound may include 2,4-bis(trichloromethyl)-6-(4-methoxyphenyl)-1,3,5-triazine, 2,4-bis(trichloromethyl)-6-(4-methoxynaphthyl)-1,3,5-triazine, 2,4-bis(trichloromethyl)-6-piperonyl-1,3,5-triazine, 2,4-bis(trichloromethyl)-6-(4-methoxystyryl)-1,3,5-triazine, 2,4-bis(trichloromethyl)-6-[2-(5-methyl furan-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, and 2,4-bis(trichloromethyl)-6-[2-(3,4-dimethoxyphenyl)ethenyl]-1,3,5-triazine.

The biimidazole-based compound may include 2,2'-bis(2-chlorophenyl)-4,4',5,5'-tetraphenylbiimidazole, 2,2'-bis(2,3-dichlorophenyl)-4,4',5,5'-tetraphenylbiimidazole, 2,2'-bis(2-chlorophenyl)-4,4',5,5'-tetra(alkoxyphenyl)biimidazole, 2,2'-bis(2-chlorophenyl)-4,4',5,5'-tetra(trialkoxyphenyl)biimidazole, and an imidazole compound in which 4,4',5,5' position of a phenyl group is substituted by a carboalkoxy group.

The oxime-based compound may include compounds represented by Chemical Formulas 3, 4, and 5.

[Chemical Formula 3]

[Chemical Formula 4]

[Chemical Formula 5]

In addition to the aforementioned examples of the photopolymerization initiator, other photopolymerization initiators commonly used in the pertinent art may also be used. For example, a benzoin-based compound, a benzophenone-based compound, a thioxanthone-based compound, an anthracene-based compound, and the like, may be used as the photopolymerization initiator, which may be used alone or in combination of two or more thereof.

The photosensitive resin composition may further comprise at least one selected from an amine compound and a carboxylic acid compound as a photopolymerization initiator auxiliary agent.

Among the examples of the photopolymerization initiator auxiliary agent, the amine compound of the photopolymerization initiator auxiliary agent may include, for example, an aliphatic amine compound such as triethanolamine (TEA), methyldiethanolamine (MDEA), and triisopropanolamine, and an aromatic amine compound such as 4-dimethylaminobenzoic acid methyl, 4-dimethylaminobenzoic acid ethyl, 4-dimethylaminobenzoic acid isoamyl, 4-dimethylaminobenzoic acid 2-ethylhexyl, benzoic acid 2-dimethylaminoethyl, N,N-dimethylpara toluidine, 4,4'-bis(dimethylamino) benzophenone (also referred to as Michler's ketone), and 4,4'-bis(diethylamino)benzophenone. In particular, an aromatic amine compound may be used as a photopolymerization initiator auxiliary agent.

The carboxylic acid compound may include, for example, an aromatic heteroacetic acid such as phenylthioacetic acid, methylphenylthioacetic acid, ethylphenylthioacetic acid, methylethylphenylthioacetic acid, dimethylphenylthioacetic acid, methoxyphenylthioacetic acid, dimethoxyphenylthioacetic acid, chlorophenylthioacetic acid, dichlorophenylthioacetic acid, N-phenylglycine, phenoxyacetic acid, naphthylthioacetic acid, N-naphthylglycine, and naphthoxy acetic acid.

The photopolymerization initiator may be included in the photosensitive resin composition in an amount of about 0.1 wt % to about 20 wt % with respect to the total weight of the solid content of the photosensitive resin composition. In the case in which the amount of the photopolymerization initiator is in the range of about 0.1 wt % to about 20 wt %, photoreactivity of the photosensitive resin composition may be excellent such that photopolymerization may be readily performed and a fine pattern may be easily produced. For example, the photopolymerization initiator may be used in a range of about 0.5 wt % to about 15 wt % with respect to the total weight of the solid content.

The photosensitive resin composition may comprise an alkali soluble resin. Accordingly, during the process of forming the pattern, the non-exposed portion of the photosensitive resin composition may be dissolved in an alkali developing solution to be removed.

The alkali soluble resin may comprise a carboxylic acid-based compound having an unsaturated bond and a carboxylic acid group and a monomer which is polymerizable with a carboxylic acid-based compound.

The carboxylic acid-based compound having the unsaturated bond and the carboxylic acid group may comprise a monocarboxylic acid-based compound such as acrylic acid, methacrylic acid, and crotonic acid; a dicarboxylic acid-based compound such as fumaric acid, mesaconic acid, and itaconic acid; an anhydride of dicarboxylic acid; and a mono(meth)acrylate-based compound of a polymer having a carboxyl group and a hydroxyl group at both ends thereof such as w-carboxypolycaprolactone mono(meth)acrylate. However, the type of the carboxylic-acid based compound having the unsaturated bond and the carboxylic acid group is not limited thereto, and the above examples may be used alone or in combination of two or more thereof.

Among these, in particular, acrylic acid or methacrylic acid may be used for preparing the alkali soluble resin. Acrylic acid or methacrylic acid may have excellent copolymerization reactivity and excellent solubility with respect to a developing solution.

The monomer which is polymerizable with the carboxylic acid-based compound may comprise an alkylester-based compound substituted or unsubstituted by unsaturated carboxylic acid such as methyl(meth)acrylate, ethyl(meth)acrylate, butyl(meth)acrylate, 2-hydroxyethyl(meth)acrylate, and aminoethyl(meth)acrylate; an unsaturated carboxylic acid ester-based compound having an alicyclic substituent such as cyclopentyl(meth)acrylate, cyclohexyl(meth)acrylate, methylcyclohexyl(meth)acrylate, cycloheptyl(meth) acrylate, cyclooctyl(meth)acrylate, methyl(meth)acrylate, cyclopentenyl(meth)acrylate, cyclohexenyl(meth)acrylate, cycloheptenyl(meth)acrylate, cyclooctenyl(meth)acrylate, menthadienyl(meth)acrylate, isobornyl(meth)acrylate, pinanyl(meth)acrylate, adamantyl(meth)acrylate, norbornyl (meth)acrylate, and pinenyl(meth)acrylate; an unsaturated carboxylic acid ester-based compound having a curable substituent such as 3-((meth)acryloyloxymethypoxetane, 3-((meth)acryloyloxymethyl)-3-ethyloxetane, 3-((meth) acryloyloxymethyl)-2-methyloxetane, 3-((meth)acryloyloxymethyl)-2-trifluoromethyloxetane; a glycol-based mono-saturated carboxylic acid ester-based compound such as oligoethyleneglycol monoalkyl(meth)acrylate; an unsaturated carboxylic acid ester-based compound having an aromatic ring such as benzyl(meth)acrylate and phenoxy(meth) acrylate; an aromatic vinyl compound such as styrene, α-methylstyrene, and vinyltoluene; carboxylic acid vinyl ester such as acetic acid vinyl and propionic acid vinyl; a cyanide vinyl compound such as (meth)acrylonitrile and α-chloroacrylronitrile; an aliphatic compound having an oxetane group such as glycidyl(meth)acrylate, 3,4-epoxycyclohexyl(meth)acrylate, 3,4-epoxycyclohexylmethyl(meth) acrylate, methylglycidyl(meth)acrylate, 3-(methacryloyloxymethyl)oxetane, 3-(methacryloyloxymethyl)-3-ethyloxetane, 3-(methacryloyloxymethyl)-2-methyloxetane, 3-(methacryloyloxymethyl)-2-trifluoromethyloxetane, 3-(methacryloyloxymethyl)-2-pentafluoroethyloxetane, 3-(methacryloyloxymethyl)-2-phenyloxetane, 3-(methacryloyloxymethyl)-2,2-difluorooxetane, 3-(methacryloyloxymethyl)-2,2,4-trifluorooxetane, 3-(methacryloyloxymethyl)-2,2,4,4-tetrafluorooxetane, 3-(methacryloyloxyethyl)oxetane, 3-(methacryloyloxyethyl)-3-ethyloxetane, 2-ethyl-3-(methacryloyloxyethyl)oxetane, 3-(methacryloyloxyethyl)-2-trifluoromethyloxetane, 3-(methacryloyloxyethyl)-2-pentafluoroethyloxetane, 3-(methacryloyloxyethyl)-2-phenyloxetane, 2,2-difluoro-3-(methacryloyloxyethyl)oxetane, 3-(methacryloyloxyethyl)-2,2,4-trifluorooxetane, 3-(methacryloyloxyethyl)-2,2,4,4-tetrafluorooxetane, 3-(acryloyloxymethyl)oxetane, 3-(acryloyloxymethyl)-3-ethyloxetane, 3-(acryloyloxymethyl)-2-methyloxetane, 3-(acryloyloxymethyl)-2-trifluoromethyloxetane, 3-(acryloyloxymethyl)-2-pentafluoroethyloxetane, 3-(acryloyloxymethyl)-2-phenyloxetane, 3-(acryloyloxymethyl)-2,2-difluorooxetane, 3-(acryloyloxymethyl)-2,2,4-trifluorooxetane, 3-(acryloyloxymethyl)-2,2,4,4-tetrafluorooxetane, 3-(acryloyloxyethyl)oxetane, 3-(acryloyloxyethyl)-3-ethyloxetane, 2-ethyl-3-(acryloyloxyethyl)oxetane, 3-(acryloyloxyethyl)-2-trifluoromethyloxetane, 3-(acryloyloxyethyl)-2-pentafluoroethyloxetane, 3-(acryloyloxyethyl)-2-phenyloxetane, 2,2-difluoro-3-(acryloyloxyethyl)oxetane, 3-(acryloyloxyethyl)-2,2,4-trifluorooxetane, 3-(acryloyloxyethyl)-2,2,4,4-tetrafluorooxetane and an unsaturated bond; an alicyclic compound having an epoxy group such as epoxidized dicyclodecanyl(meth)acrylate, 3,4-epoxytricyclodecane-8-yl (meth)acrylate, 3,4-epoxytricyclodecane-8-yl(meth)acrylate, epoxidized dicyclopentanyloxyethyl(meth)acrylate, (2-(3,4-epoxytricyclodecane-9-yloxy)ethyl(meth)acrylate, 2-(3,4-epoxytricyclodecane-8-yloxy)ethyl(meth)acrylate, and epoxidized dicyclopentanyloxyhexy(meth)acrylate and an unsaturated bond; an epoxy-based compound such as dicyclopentane, tricyclodecane, norbornane, isonorbornane, bicyclooctane, cyclononane, bicycloundecane, tricyclooundecane, bicyclododecane, and tricyclododecane; and dicarbonyl imide such as N-phenylmaleimide, N-cyclohexylmaleimide, N-benzylmaleimide, N-succinimidyl-3-maleimidebenzoate, N-succinimidyl-4-maleimidebutyrate, N-succinimidyl-6-maleimidecaproate, N-succinimidyl-3-maleimidepropionate, and N-(9-acrydinyl)maleimide.

As used herein, "(meth)acrylate" may refer to one or both of acrylate and methacrylate.

The alkali soluble resin may be included in the photosensitive resin composition in an amount of about 5 wt % to about 80 wt % with respect to the total weight of the solid content of the photosensitive resin composition. In the case in which the amount of the alkali soluble resin is in the range of about 5 wt % to about 80 wt %, solubility of the photosensitive resin composition with respect to a developing solution may be excellent such that the non-exposed portion of the photosensitive resin composition may be easily dissolved. For example, the alkali soluble resin may be used in the amount of about 10 wt % to about 70 wt % with respect to the total weight of the solid content.

The photosensitive resin composition may further comprise an additive as necessary. The additive may include a filler, a polymer compound, a curing agent, a dispersant, an adhesion promoter, an antioxidant, a UV light absorber, an anticoagulant, and the like.

The type of the solvent is not particularly limited. Various organic solvents may be used in the field of the photosensitive resin composition as the solvent.

Examples of the solvent may include ethyleneglycolmonoalkylether such as ethyleneglycolmonomethylether, ethyleneglycolmonoethylether, ethyleneglycolmonopropylether, and ethyleneglycolmonobutylether; diethyleneglycoldialkyl ether such as diethyleneglycoldimethylether, diethyleneglycoldiethylether, diethyleneglycoldipropylether, and diethyleneglycolbutylether; ethyleneglycolalkyletheracetate such as methylcellosolveacetate and ethylcellosolveacetate; propyleneglycoldialkylether such as propyleneglycolmonomethylether; alkyleneglycolalkyletheracetate such as propyleneglycolmonomethyletheracetate, propyleneglycolmonoethyletheracetate, propyleneglycolmonopropyletheracetate, methoxybutylacetate, and methoxypentylacetate; aromatic hydrocarbon such as benzene, toluene, xylene, and mesitylene; ketone such as methylethylketone, acetone, methylamylketone, methylisobutylketone, and cyclohexanone; alcohol such as ethanol, propanol, butanol, hexanol, cyclohexanol, ethyleneglycol, and glycerin; ester such as 3-ethoxypropionic acid ethyl and 3-methoxypropionic acid methyl; cyclic ester such as γ-butyrolactone (GBL), which may be used alone or in combination of two or more types thereof.

The amount of the solvent may be in a range of about 60 wt % to about 95 wt % with respect to the total weight of the photosensitive resin composition. In the case in which the amount of the solvent is in the range of about 60 wt % to about 95 wt %, coatability of the photosensitive resin composition may be excellent. For example, the solvent may be used in a range of about 70 wt % to about 90 wt % with respect to the total weight of the photosensitive resin composition.

The color filter prepared using the photosensitive resin composition according to the third exemplary embodiment may represent a high-quality color due to having a reduced variation in a film thickness and smoothness.

Hereinafter, a further detailed description of the present invention will be provided with reference to Preparation Examples, Comparative Examples, and Experimental Examples. However, the scope of the present invention is not limited thereto. A unit used to measure an amount in Preparation Examples, Comparative Examples, and Experimental Examples may be based on weight.

[Preparation Example 1] Synthesis of Quantum Dot (Phosphor) Having CdSe (Core)/ZnS(Shell) Structure CdO (0.4 millimoles (mmol)), zinc acetate (4 mmol), and oleic acid (5.5 milliliters (mL)) are put into a reaction container along with 1-octadecene (20 mL) and then heated to 150 Celsius degrees (° C.). A reactant obtained therefrom is laid aside under a vacuum state of 100 millitorr (mTorr) to remove acetic acid generated during a reaction of zinc acetate with oleic acid due to the heating. The reactant is heated to 310° C. to obtain a transparent mixture and maintained at 310° C. for 20 minutes, and a Se and S solution obtained by dissolving 0.4 mmol of Se powder and 2.3 mmol of S powder in 3 mL of trioctylphosphine is rapidly injected into a reaction container in which $Cd(OA)_2$ and $Zn(OA)_2$ are held, where OA is oleic acid. A reaction mixture obtained therefrom is grown at 310° C. for 5 minutes, and the growth of the reaction mixture is suspended using an ice bath. A reactant obtained therefrom is precipitated in ethanol, a nano-phosphor is separated from the reactant using a centrifugal separator, and impurities are cleaned therefrom using chloroform and ethanol. As a result, a quantum dot having a CdSe (core)/ZnS (shell) structure stabilized by oleic acid is obtained.

[Preparation Example 2] Preparation of Alkali Soluble Resin

A flask provided with a stirrer, a thermometer, a reflex condenser, a dropping lot (hereinafter, referred to as a dropping funnel), and a nitrogen gas inlet tube is prepared. 45 parts by weight of N-benzylmaleimide, 45 parts by weight of methacrylic acid, 10 parts by weight of tricyclodecyl methacrylate, 4 parts by weight of tert-butylperoxy-2-ethylhexanoate, and 40 parts by weight of propyleneglycolmonomethyletheracetate (hereinafter, referred to "PGMEA") are injected into the flask and mixed by stirring to prepare a monomer dropping funnel; and 6 parts by weight of n-dodecanethiol and 24 parts by weight of PGMEA are injected into the flask and mixed by stirring to prepare a chain transfer agent dropping funnel. 395 parts by weight of PGMEA is injected into the flask, an atmosphere in the flask is changed from an air atmosphere to a nitrogen atmosphere, and a temperature of the flask is elevated to 90° C. while stirring is performed in the flask. The monomer and the chain transfer agent are dropped from their respective dropping funnels. The dropping of the monomer and the chain transfer agent are each carried out for two hours while maintaining the temperature at 90° C., the temperature is elevated therefrom to 110° C. after an hour to be maintained thereat for three hours, and a gas inlet tube is introduced thereto to initiate bubbling using a mixed gas of oxygen/nitrogen=5/95 volume/volume (v/v). 10 parts by weight of glycidylmethacrylate, 0.4 parts by weight of 2,2'-methylenebis(4-methyl-6-tert-butylphenol), and 0.8 parts by weight of trimethylamine are injected into the flask to be reacted at 110° C. for 8 hours, and a reactant obtained therefrom is cooled to room temperature to thereby obtain an alkali soluble resin including a solid content of about 29.1 wt %, a weight average molecular weight (WAMW) of 32,000, and an acidic value of 114 milligrams of potassium hydroxide per gram (mgKOH/g).

[Inventive Examples 1 Through 5 and Comparative Examples 1 Through 5] Preparation of Photosensitive Resin Composition As represented by Table 1, respective components, that is, solid contents, are mixed and added with a solvent, for example, propyleneglycolmonomethyletheracetate to be diluted to have a total amount of the solid contents to be 18 wt %, and a mixture thereof is sufficiently stirred to obtain a photosensitive resin composition.

TABLE 1

| Classification | QD | Photopolymerizable Compound | C-1 | C-2 | C-3 | C-4 | C-5 | C-6 | C-7 | C-8 | Alkali Soluble Resin |
|---|---|---|---|---|---|---|---|---|---|---|---|
| Inventive Example 1 | 30 | 35 | 5 | | | | | | | | 30 |
| Inventive Example 2 | 30 | 35 | | 5 | | | | | | | 30 |
| Inventive Example 3 | 30 | 35 | 2 | 3 | | | | | | | 30 |
| Inventive Example 4 | 30 | 35 | | | 5 | | | | | | 30 |
| Inventive Example 5 | 30 | 35 | 3 | | | 2 | | | | | 30 |
| Comparative Example 1 | 30 | 35 | | | 5 | | | | | | 30 |
| Comparative Example 2 | 30 | 35 | | | | | 5 | | | | 30 |
| Comparative Example 3 | 30 | 35 | | | | | | 5 | | | 30 |
| Comparative Example 4 | 30 | 35 | | | | | | | 5 | | 30 |
| Comparative Example 5 | 30 | 35 | | | | | | | | 5 | 30 |

(A) Phosphor: the quantum dot (QD) having the CdSe (core)/ZnS (shell) structure prepared as in Preparation Example 1
(B) Photopolymerizable compound: dipentaerythritolhexacrylate (KAYARAD™ DPHA; manufactured by Nippon Kayaku Co., Ltd.)
(C) Photopolymerization initiator
C-1: acetophenone-based compound, IRGACURE ®-907 (manufactured by BASF Corporation)
C-2: acetophenone-based compound, IRGACURE ®-651 (manufactured by BASF Corporation)
C-3: acetophenone-based compound, IRGACURE ®-184 (manufactured by BASF Corporation)
C-4: phosphineoxide-based compound, IRGACURE ®-819 (manufactured by BASF Corporation)
C-5: triazine-based compound, TAZ-101 (manufactured by Midori Kagaku Co., Ltd.)
C-6: oxime-based compound, IRGACURE ® OXE01 (manufactured by BASF Corporation)
C-7: oxime-based compound, IRGACURE ® OXE02 (manufactured by BASF Corporation)
C-8: biimidazole-based compound, CZ-HABI (manufactured by Changzhou Tronly New Electronic Materials Co., Ltd. Corp.)
(D) Alkali Soluble Resin: the alkali soluble resin prepared as in Preparation Example 2

[Inventive Examples 6 Through 10 and Comparative Examples 6 Through 10] Preparation of Color Filter The color filters are prepared using the photosensitive resin compositions prepared as in Inventive Examples 1 through 5 and Comparative Examples 1 through 5, and used in Inventive Examples 6 through 10 and Comparative Examples 6 through 10, respectively.

In detail, the photosensitive resin compositions prepared in Inventive Examples 1 through 5 and Comparative Examples 1 through 5 are coated on a glass substrate using a spin coating scheme, and the glass substrate is disposed on a heating plate to be maintained at 100° C. for three minutes, such that a thin film formed of the photosensitive resin composition is formed.

A pattern mask including a square-shaped light transmitting pattern having a size of 20 millimeters (mm) length×20 mm width and a line-shaped light transmitting pattern having a width of 100 micrometers (μm) is disposed on the thin film formed of the photosensitive resin composition, and a UV light is irradiated onto the pattern mask. In this instance, as such a UV light source, a UV light is irradiated at 365 nm with an exposure dose of 200 millijoules per square centimeter (mJ/cm²) under an air atmosphere, using an ultra-high pressure mercury lamp (USH-250D available from Ushio Inc.).

Subsequent to the UV irradiation, the glass substrate is dipped in a KOH aqueous solution having a pH of 10.5 for 80 seconds to be developed. The glass substrate is cleaned using distilled water, is dried using nitrogen gas, and is heated in a heating oven at 150° C. for 10 minutes, such that a color filter pattern is completed. A thickness of the color filter pattern is 3.0 μm.

[Experimental Example 1] Measurement of Pattern Precision

Among the color filters prepared in Inventive Examples 6 through 10 and Comparative Examples 6 through 10, a width of a color filter pattern obtained by the line-shaped light transmitting pattern having a width of 100 μm is measured using an OM (Olympus Matt equipment (ECLIPSE LV100POL manufactured by Nikon Corporation). The width of the light transmitting pattern formed on the pattern mask and the measured width of the color filter pattern (hereinafter, referred to as a measured pattern width) are compared with one another to calculate a pattern error. That is, the pattern error is calculated by Equation 1.

Pattern error (Δ)=(width of light transmitting pattern, 100 μm)−(measured pattern width, in μm)   [Equation 1]

In the case in which a value of the pattern error is greater than 20 μm, it may be difficult to achieve a fine, and thus providing a fine pixel may be difficult; in the case in which the value of the pattern error is below zero, process defects may be caused.

[Experimental Example 2] Measurement of Light Intensity (Luminance)

Among the color filters prepared in Inventive Example 6 through 10 and Comparative Examples 6 through 10, light is irradiated onto the square-shaped color filter pattern having the size of 20 mm×20 mm, using 365 nm tube-type 4 watts (W) UV lamp (VL-4LC manufactured by VILBER LOURMAT). An intensity (luminance) of light emitted from the light-irradiated color filter having a wavelength of 550 nm is measured using a spectrometer (manufactured by Ocean Optics, Inc.). As the measured luminance of light is increased, a light emission property is evaluated to be improved.

The pattern error measured in Experimental Example 1 and the luminance of the light measured in Experimental Example 2 are represented in Table 2.

TABLE 2

| Classification | Pattern Error (μm) | Luminance (when the wavelength of the light is $\lambda$ = 550 nm) (candela per square meter) (cd/m$^2$) |
|---|---|---|
| Inventive Example 6 | 7 | 22,375 |
| Inventive Example 7 | 5 | 26,480 |
| Inventive Example 8 | 6 | 25,630 |
| Inventive Example 9 | 6 | 25,110 |
| Inventive Example 10 | 6 | 20,679 |
| Comparative Example 6 | 7 | 10,060 |
| Comparative Example 7 | 7 | 6,370 |
| Comparative Example 8 | 8 | 8,690 |
| Comparative Example 9 | 12 | 4,320 |
| Comparative Example 10 | 4 | 5,170 |

The color filter prepared using the photosensitive resin composition (Inventive Examples 1 through 5) including the acetophenone-based compound as the photopolymerization initiator has a pattern error in a range of about +5 μm to about +7 μm. Accordingly, the photosensitive resin compositions of Inventive Examples 1 through 5 may be evaluated to have an excellent pattern forming property. In addition, it may be appreciated that the color filters prepared using the photosensitive resin compositions of Inventive Examples 1 through 5 exhibit light emission properties 3 to 6 times higher than the color filters prepared using the photosensitive resin compositions of Comparative Examples 6 through 10.

As set forth above, according to exemplary embodiments, the photosensitive resin composition may comprise a phosphor, and through the use of the photosensitive resin composition, damage to the phosphor may be prevented during the preparation process of the color filter. Accordingly, the color filter prepared using the photosensitive resin composition according to the exemplary embodiment may represent a high-quality color.

From the foregoing, it will be appreciated that various embodiments in accordance with the present disclosure have been described herein for purposes of illustration, and that various modifications may be made without departing from the scope and spirit of the present teachings. Accordingly, the various embodiments disclosed herein are not intended to be limiting of the true scope and spirit of the present teachings. Various features of the above described and other embodiments can be mixed and matched in any manner, to produce further embodiments consistent with the invention.

What is claimed is:

1. A photosensitive resin composition comprising:
a solvent in an amount of about 60 percentage by weight (wt %) to about 95 wt %; and a solid content in an amount of about 5 wt % to about 40 wt % with respect to a total weight of the photosensitive resin composition,
wherein the solid content comprises:
a phosphor in an amount of about 5 wt % to about 90 wt %, wherein the phosphor is a quantum dot
a photopolymerizable compound in an amount of about 4 wt % to about 70 wt %;
an acetophenone-based photopolymerization initiator in an amount of about 0.1 wt % to about 20 wt %; and
an alkali soluble resin in an amount of about 5 wt % to about 80 wt %, with respect to a total weight of the solid content; and
wherein the quantum dot has a core-shell structure comprising a core and a shell covering the core,
wherein the core comprises at least one compound selected from the group consisting of CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN, InAs, and ZnO, and
the shell comprises at least one compound selected from the group consisting of CdSe, CdTe, CdO, ZnS, ZnSe, ZnTe, InP, InS, GaP, GaN, GaO, InZnP, InGaP, InGaN, InZnSCdSe, PbS, SrSe, and HgSe, and
the alkali soluble resin comprises
a carboxylic acid-based compound having an unsaturated bond and a carboxylic acid group;
an unsaturated carboxylic acid ester-based compound having an alicyclic substituent; and
and a monomer having an epoxy group selected from the group consisting of glycidyl (meth)acrylate, 3,4-epoxycyclohexyl(meth)acrylate, 3,4-epoxycyclohexylmethyl (meth)acrylate and methylglycidyl(meth)acrylate.

2. The photosensitive resin composition of claim 1, wherein the photopolymerization initiator comprises at least one compound selected from the group consisting of diethoxyacetophenone, 2-hydroxy-2-methyl-1-phenylpropan-1-one, benzyl dimethyl ketal, 2-hydroxy-1-[4-(2-hydroxyethoxy)phenyl]-2-methylpropan-1-one, 1-hydroxycyclohexyl phenyl ketone, 2-methyl-1-(4-methylthiophenyl)-2-morpholinopropan-1-one, 2-benzyl-2-dimethylamino-1-(4-morpholinophenyl)butne-1-one, and 2-hydroxy-2-methyl-1-[4-(1-methylvinyl)phenyl]propan-1-one.

3. The photosensitive resin composition of claim 1, wherein the photopolymerization initiator comprises a compound represented by Chemical Formula 2:

[Chemical Formula 2]

wherein $R_2$ through $R_5$ are each independently a hydrogen atom, a halogen atom, a hydroxyl group, a phenyl group substituted or unsubstituted by an alkyl group having 1 to 12 carbon atoms, a benzyl group substituted or unsubstituted by an alkyl group having 1 to 12 carbon atoms, or a naphthyl group substituted or unsubstituted by an alkyl group having 1 to 12 carbon atoms.

4. The photosensitive resin composition of claim 1, wherein the phosphor comprises one of a red phosphor, a green phoshpor, and a blue phosphor.

5. A photosensitive resin composition, comprising:
a solvent in an amount of about 60 percentage by weight (wt %) to about 95 wt %; and a solid content in an amount of about 5 wt % to about 40 wt % with respect to a total weight of the photosensitive resin composition,
wherein the solid content comprises:
a phosphor in an amount of about 5 wt % to about 90 wt %, wherein the phosphor comprises at least one compound selected from the group consisting of $Tb_3Al_5O_{12}:Ce^{3+}$(TAG:Ce), $(Sr,Ba,Ca)_2SiO_4:Eu^{2+}$, $(Sr,Ba,Ca,Mg,Zn)_2Si(OD)_4:Eu^{2+}$ (D=F,Cl,S,N,Br), $Ba_2SiO_4:Eu^{2+}$, $Ca_3(Sc,Mg)_2Si3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, $\beta$-$SiAlON:Eu^{2+}$, Ca-$\alpha$-$SiAlON:Eu^{2+}$, $Sr_2Si_5N_8:Eu^{2+}$, $(Sr,Ba)Al_2O_4:Eu^{2+}$, and $(Mg,Sr)Al_2O_4:Eu^{2+}$,
a photopolymerizable compound in an amount of about 4 wt % to about 70 wt %;
an acetophenone-based photopolymerization initiator in an amount of about 0.1 wt % to about 20 wt %; and
an alkali soluble resin in an amount of about 5 wt % to about 80 wt %, with respect to a total weight of the solid content.

6. A display device comprising:
a substrate; and
a plurality of color filters on the substrate,
wherein the color filter comprises a polymer resin, a phosphor, and an acetophenone-based compound, wherein the phosphor is a quantum dot; and
wherein the quantum dot has a core-shell structure comprising a core and a shell covering the core,
wherein the core comprises at least one compound selected from the group consisting of CdTe, ZnS, ZnSe, ZnTe, CdSeTe, CdZnS, CdSeS, PbSe, PbS, PbTe, AgInZnS, HgS, HgSe, HgTe, GaN, GaP, GaAs, InP, InZnP, InGaP, InGaN, InAs, and ZnO, and
the shell comprises at least one compound selected from the group consisting of CdSe, CdTe, CdO, ZnS, ZnSe, ZnTe, InP, InS, GaP, GaN, GaO, InZnP, InGaP, InGaN, InZnSCdSe, PbS, SrSe, and HgSe, and
the alkali soluble resin comprises
a carboxylic acid-based compound having an unsaturated bond and a carboxylic acid group;
an unsaturated carboxylic acid ester-based compound having an alicyclic substituent; and
and a monomer having an epoxy group selected from the group consisting of glycidyl (meth)acrylate, 3,4-epoxycyclohexyl(meth)acrylate, 3,4-epoxycyclohexylmethyl (meth)acrylate and methylglycidyl(meth)acrylate.

7. The display device of claim 6, wherein the acetophenone-based compound comprises at least one compound selected from the group consisting of diethoxyacetophenone, 2-hydroxy-2-methyl-1-phenylpropan-1-one, benzyl dimethyl ketal, 2-hydroxy-1-[4-(2-hydroxyethoxy)phenyl]-2-methylpropan-1-one, 1-hydroxycyclohexyl phenyl ketone, 2-methyl-1-(4-methylthiophenyl)-2-morpholinopropan-1-one, 2-benzyl-2-dimethylamino-1-(4-morpholinophenyl)butane-1-one, and 2-hydroxy-2-methyl-1-[4-(1-methylvinyl)phenyl]propan-1-one.

8. The display device of claim 6, wherein the acetophenone-based compound comprises a compound represented by Chemical Formula 2:

[Chemical Formula 2]

wherein $R_2$ through $R_5$ are each independently a hydrogen atom, a halogen atom, a hydroxyl group, a phenyl group substituted or unsubstituted by an alkyl group having 1 to 12 carbon atoms, a benzyl group substituted or unsubstituted by an alkyl group having 1 to 12 carbon atoms, or a naphthyl group substituted or unsubstituted by an alkyl group having 1 to 12 carbon atoms.

9. The display device of claim 6, wherein the phosphor comprises one of a red phosphor, a green phoshpor, and a blue phosphor.

10. A display device, comprising:
a substrate; and
a plurality of color filters on the substrate,
wherein the color filter comprises a polymer resin, a phosphor, and an acetophenone-based compound, wherein the phosphor comprises at least one compound selected from the group consisting of $Y_3Al_5O_{12}:Ce^{3+}$ (YAG:Ce), $Tb_3Al_5O_{12}:Ce^{3+}$(TAG:Ce), $(Sr,Ba,Ca)_2SiO_4:Eu^{2+}$, $(Sr,Ba,Ca,Mg,Zn)_2Si(OD)_4:Eu^{2+}$ (D=F,Cl, S,N,Br), $Ba_2MgSi_2O_7:Eu^{2+}$, $Ba_2SiO_4:Eu^{2+}$, $Ca_3(Sc,Mg)_2Si3O_{12}:Ce^{3+}$, $(Ca,Sr)S:Eu^{2+}$, $(Sr,Ca)Ga_2S_4:Eu^{2+}$, $SrSi_2O_2N_2:Eu^{2+}$, $SiAlON:Ce^{3+}$, $\beta$-$SiAlON:Eu^{2+}$, Ca-$\alpha$-$SiAlON:Eu^{2+}$, $Ba_3Si_6O_{12}N_2:Eu^{2+}$, $Sr_2Si_5N_8:Eu^{2+}$, $(Sr,Ba)Al_2O_4:Eu^{2+}$, $(Mg,Sr)Al_2O_4:Eu^{2+}$, and $BaMg_2Al_{16}O_{27}:Eu^{2+}$.

* * * * *